United States Patent [19]
Lo et al.

[11] Patent Number: 5,134,369

[45] Date of Patent: Jul. 28, 1992

[54] THREE AXIS MAGNETOMETER SENSOR FIELD ALIGNMENT AND REGISTRATION

[75] Inventors: Allen K. Lo, Diamond Bar; Wilbur W. Eaton, Jr., Placentia, both of Calif.; Ben R. Breed, Austin, Tex.

[73] Assignee: Hughes Aircraft Company, Los Angeles, Calif.

[21] Appl. No.: 667,996

[22] Filed: Mar. 12, 1991

[51] Int. Cl.$^5$ .......................... G01V 3/08; G01V 3/38; G01R 33/02; G01B 7/14

[52] U.S. Cl. .................... 324/245; 324/202; 324/207.12; 324/207.26; 324/246; 324/247; 324/345; 324/207.22; 364/571.01

[58] Field of Search ............ 324/202, 207.12, 207.15, 324/207.22, 207.26, 245, 246, 247, 326, 331, 345, 346; 33/355 R, 356; 364/420, 571.01

[56] References Cited

U.S. PATENT DOCUMENTS

| | | | |
|---|---|---|---|
| 4,600,883 | 7/1986 | Egli et al. | 324/246 X |
| 4,727,329 | 2/1988 | Behr | 324/345 |
| 4,731,582 | 3/1988 | Posseme et al. | 324/247 X |
| 4,767,988 | 8/1988 | Wilson | 324/247 |
| 4,875,014 | 10/1989 | Roberts et al. | 324/326 |

*Primary Examiner*—Gerard R. Strecker
*Attorney, Agent, or Firm*—Wanda K. Denson-Low

[57] ABSTRACT

An alignment process is applied to each sensor of an array of three axis magnetic sensors to electronically align the three axes of each sensor after the array has been deployed. The alignment process compensates for each sensor not being aligned perfectly with the earth's N-S, E-W and vertical magnetic field components. A field registration process is applied to each sensor of the array that uses a dipole moment detection and localization process and the alignment process combined with a known calibrated dipole source to define the shape of the array. The present invention improves the performance of the array of sensors in detecting magnetic anomalies by digitally compensating for sensor-to-sensor nonalignment and magnetic interferers within interfering range. The alignment process electronically aligns the three axes of each of the sensors to gain maximum performance from the sensor array. Using digital signal processing techniques reduces the physical deployment requirements on the sensors and their relative positions. The alignment process allows the use of three axis vector magnetometers in a distributed field without having to lay each sensor in perfect alignment with the earth's three magnetic axis. This simplifies the deployment requirements and allows for maximizing the system performance.

6 Claims, 2 Drawing Sheets

THREE AXIS MAGNETOMETER SENSOR FIELD ALIGNMENT AND REGISTRATION

BACKGROUND

The present invention relates generally to three axis magnetometer sensors, and more particularly, to three axis magnetometer sensor alignment and field registration.

Reference is made to U.S. patent application Ser. No. 07/616,158, filed Nov. 20, 1990, for "Dipole Moment Detection and Localization," assigned to the assignee of the present invention, the contents of which is incorporated herein by reference. The dipole moment detection and localization process described in this application has been demonstrated to yield dramatic performance improvement over currently available magnetic anomaly detection systems using a single sensor to detect a change in the total local magnetic field. Applying the dipole moment detection and localization process to the output of a linear array of sensors increases the detection sensitivity and provides for localization and orientation of the dipole.

Notwithstanding the beneficial capabilities provided by the above-cited detection and localization process, there is a need for additional processing that may be combined with the above-cited processing to enhance performance.

SUMMARY OF THE INVENTION

The basic concept of the present invention is to extend the dipole moment detection and localization process disclosed in the above-cited patent application to improve its performance. The use of a sensor axis alignment process and a sensor field registration process in conjunction with the dipole moment detection and localization process disclosed in the above-cited patent application enhances system performance and reduces system costs, without requiring additional resources.

The present invention is adapted to improve the dipole detection performance of a stationary array of three axis magnetic sensors by digitally compensating for sensor-to-sensor nonalignment, and magnetic interferers within interfering range of the magnetic field of the dipole. The alignment process electronically aligns the three axes of each of the sensors to gain maximum performance from the sensor field. The alignment process is applied to each sensor to align the three axes of the sensor after the array has been deployed. The alignment process compensates for the sensor not being aligned perfectly with the earths N-S, E-W and vertical magnetic field components.

More specifically the present invention provides for a method of electronically aligning output signals comprising magnetic field responses of a plurality of three axis magnetic sensors comprising a distributed sensor array subsequent to their deployment. The method comprising the steps of (1) deploying a plurality of three axis magnetic sensors; (2) sensing output signals comprising magnetic field responses along x, y, and z axes of each of the plurality of sensors; (3) electronically aligning the x axis of each magnetic sensor with a predefined earth's magnetic field by adjusting compensation values of a three axis rotation matrix associated with each sensor such that only the x axis value is nonzero; (4) electronically aligning the y and z axes of each magnetic sensor by moving a calibrated dipole source having a known magnetic strength and signature along a known path relative to the plurality of sensors and adjusting the rotation matrix of each sensor to get desired magnetic field responses at predetermined magnetic response locations along the path; and (5) repeating the above steps a predetermined number of times until the desired magnetic field responses are achieved. The method may also use earth scale events to calibrate the process by adjusting the rotation matrix to get the desired magnetic response location values in response to an earth scale event, such that all magnetic field responses respond in like manner thereto.

The field registration process is applied to each sensor of the array of sensors. The field registration process uses the three axis magnetometer alignment process, the dipole moment detection and localization process, a calibration source having a predetermined course, and permanent anomalies located in the vicinity of the array of sensors to define the shape of the array and to predict the individual sensor performance characteristics.

More specifically, the method of determining the relative locations of a plurality of sensors with respect to each other comprises the following steps: (1) electronically aligning the x, y, and z axes of each sensor of the array with the magnetic axes of the earth's magnetic field, by adjusting a rotation matrix associated with output signal derived from each sensor until a desired magnetic field response is achieved at predetermined magnetic response locations associated with the array of sensors; (2) moving a calibrated dipole source having a known magnetic strength and signature that moves through a plurality of magnetic response locations that have predetermined magnetic response values associated therewith that correspond to the calibrated dipole source relative to the array of sensors; (3) measuring the field strength generated by the calibrated dipole source as it moves along the path at each sensor location; (4) computing the relative ranges to the magnetic response locations from adjacent sensor locations; and (5) computing the relative locations of the plurality of sensors with respect to each other using the relative ranges to the magnetic response locations.

An advantage of the alignment process is to allow the use of three axis vector magnetometers in a distributed field with out having to lay each sensor in perfect alignment with the earth's three magnetic axes. This simplifies the deployment requirements and permits optimization of the system performance. An advantage of the sensor field registration process is to eliminate or lessen the effort required to align and register the sensor field. Using digital signal processing techniques reduces the physical deployment requirements on the sensors and their relative positions.

BRIEF DESCRIPTION OF THE DRAWINGS

The various features and advantages of the present invention may be more readily understood with reference to the following detailed description taken in conjunction with the accompanying drawings, wherein like reference numerals designate like structural elements and in which.

DETAILED DESCRIPTION

The present invention is used in conjunction with a dipole moment detection and localization process that uses an array or multiple arrays of magnetic sensors and digital signal processing techniques to break a magnetic field in x, y, and z components for vector sensors and into its total field component for scalar sensors at each of a plurality of positions relative to the array of sensors. In doing this, a magnetic signature of the magnetic field of a magnetic dipole located in the field is created. This magnetic signature provides an easily recognizable feature for an automatic pattern recognizing system. This process precomputes predicted target signatures for multiple magnetic orientations of the dipole at each of a plurality of range locations, and are stored in a lookup table for reference.

Input data measured by the sensors are processed against the background ambient noise using a linear model, where each sensor's output value is predicted using other sensors of the array. Also a long term time average consistent with the relative motion of a target is computed. This amounts to bandpass filtering or long term averaging of the signals from the sensor array. The bandpass filtered data is used to update the predicted data so that anomalies and other non-target data is removed from the signals that are processed. The data is then expressed in terms of Anderson functions, which are a set of mathematical functions that decompose the magnetic field into its components in each of the magnetic response locations.

Then the data expressed in terms of the Anderson functions is matched filtered, wherein it is mathematically correlated by means of a dot product with the stored precomputed predicted target signatures. The dot product, or correlation, of these two sets of data yields a set of values including the largest value in the set of correlated data and is then normalized. This normalized data is then thresholded, and if a target is present at any one of the locations, then the correlated, dot product, normalized value computed as stated above will be higher than the chosen threshold.

Figure 1:
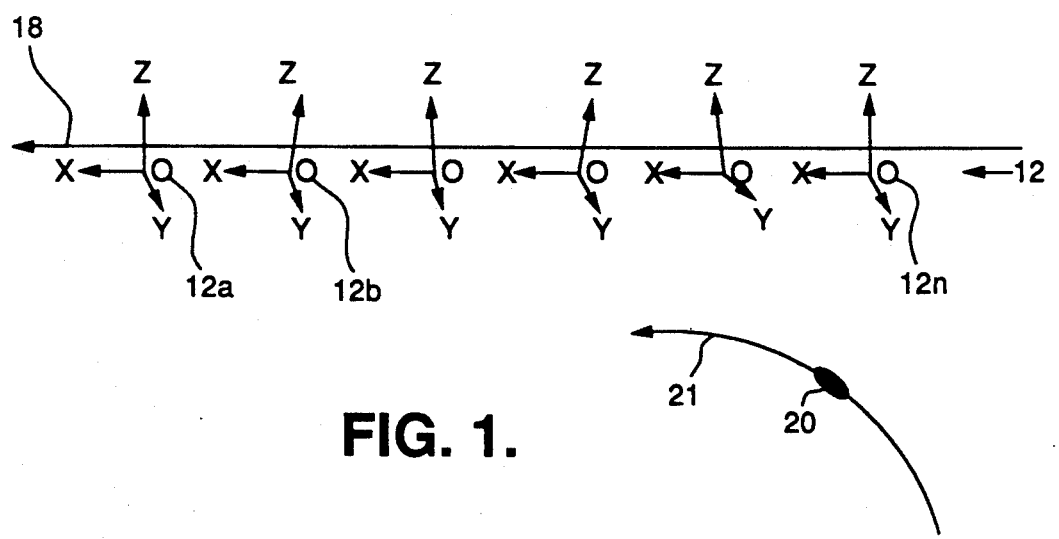
FIGS. 1-3 illustrate a three step alignment process for angularly aligning an array of sensors in accordance with the present invention.
Figure 2:
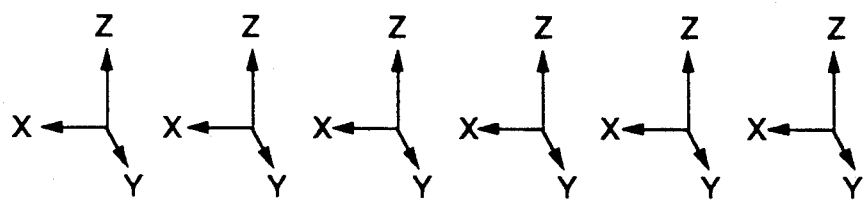
Figure 3:
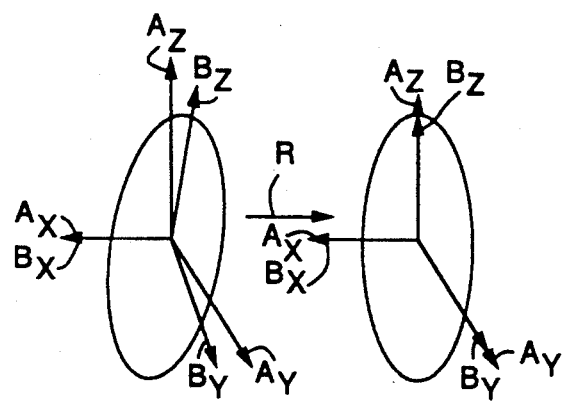

With reference to the drawing figures, FIGS. 1-3 illustrate a three step alignment process for angularly aligning an array of sensors 12 comprising individual sensors 12a-12n in accordance with the present invention. An objective of the processing involved in angularly aligning the array of sensors 12 is to determine their rotational alignment with respect to a single three dimensional reference frame, namely the earth's magnetic field components. FIG. 1 shows the random alignment of the measured sensing axes (x,y,z) of the sensors 12 relative to a selected magnetic axis of the earth, particularly shown as the earth's x axis 18.

Since the local magnetic field is a vector field, the determination of its proper representation relative to a given set of axes only requires the knowledge of the 3-D rotation matrix between the measured axes (x,y,z) and the desired set of axes. If the rotation matrix is given by R, the compensated field magnetic field measurement is given in terms of the measured vector ($H_{meas}$) by the equation $H_{comp} = R * H_{meas}$, where the compensated vector ($H_{comp}$) is in the desired coordinate system. It is the object of the field alignment process to first estimate the relative coordinate axes mismatches relative to a common coordinate system (the earth's magnetic field), and then to apply the appropriate rotations to the measurements so that all compensated values of all sensors 12a-12n are in the common coordinate system. As may be appreciated, it is not the compensation process that is complicated, since it is a simple rotation, it is the estimation of the misalignment. There are three aspects which resolve the estimation problem: the earth's steady state magnetic field, ambient magnetic noise fluctuations with their high correlation on the three axes of separated sensors 12a-12n, and the use of a calibrated magnetic dipole moving on a standard track for calibration purposes.

The three step alignment procedure using each of these aspects is depicted in FIGS. 1-3. Given the value of a steady magnetic field on three axes, it is a simple matter to find a rotation matrix which rotates this value such that its x-component is the only nonzero component. This rotation matrix is found and applied to each of the sensors 12a-12n in the array 12. At this stage of the process, it is assumed that all of the sensors 12a-12n have at least one axis in common, but also that nothing has been done to bring the other two axes into registration. Next, a target comprising a calibrated magnetic dipole source 20 with large concentrated dipole moment is brought along a known path 21 relative to the array 12 and the dipole moment detection and localization process is run on the dipole source 20 many times with an adjustment at each magnetic response location of the rotations in the y and z-planes, such that at the end, the track so produced is the best possible that exhibits the largest possible matched-field-correlation output, as is graphically shown in FIG. 2.

Finally, when the sensor axes are in substantial alignment, magnetic noise fluctuations between spatially separated sensors 12a-12n are much more correlated between common axes than between perpendicular axes. If additional alignment is needed, this effect is used to determine the rotation matrix between the angular alignment of a pair of sensor's 12a-12n which brings this correlation between common directions to a maximum.

This final rotation matrix is assumed to complete the alignment of the sensors 12a-12n graphically shown in FIG. 3. In mathematical terms, this is accomplished as follows. Let $A_x$, $A_y$, $A_z$ and $B_x$, $B_y$, $B_z$ be the residuals on the three axes of two sensors 12a-12n after substracting the long term mean. Then the cross-correlation matrix is the matrix:

$$C = E\left[\begin{pmatrix} A_x \\ A_y \\ A_z \end{pmatrix}(B_x, B_y, B_z)\right]$$

where the expectation is given by an average over time. Using this procedure, the estimate of the rotation matrix which rotates the first sensor 12a to be in alignment with the second sensor 12n is the rotation matrix R which maximizes Tr(RC) where Tr indicates the trace of the matrix, i.e. the sum of the diagonal elements.

The general approach to the alignment of the sensor axes to a common known reference has been described above. It comprises the three steps shown in FIGS. 1-3, namely placing the x-axis of each sensor 12a-12n along the direction of the DC ambient field (FIG. 1), rotation of the individual y and z-planes of the sensors 12a-12n to best match the known track of a dipole moved relative the sensor array 12 (FIG. 2), and adjustment of the alignment of the sensors 12a-12n so that pairwise, the ambient fluctuations cross-correlate test between individual axes on separate sensors 12a–12n (FIG. 3). This latter adjustment technique is based on the assumption that, in general, x-axes correlate better among themselves than x-axes correlate with y-axes, and so forth. Should this assumption not prove to be true for a proposed location, this step can be omitted and the other two steps are considered adequate for the successful operation of the system 10.

In mathematical terms, the three steps are as follows.

Step 1. Put the x-axis in the direction of the DC field. Given a three axes measurement of the DC field denoted by $H_x$, $H_y$, $H_z$, with the x-component assumed to be largest, the rotation which rotates this to H, O, O, is given by the following transformation:

$$\begin{bmatrix} Hx \\ 0 \\ 0 \end{bmatrix} = \begin{bmatrix} \frac{1}{AB} \end{bmatrix} \begin{bmatrix} H_xB & H_yB & H_zB \\ -H_yA & H_xA & 0 \\ -H_xH_z & -H_yH_z & B^2 \end{bmatrix} \begin{bmatrix} Hx \\ Hy \\ Hz \end{bmatrix}$$

where $$A = \sqrt{Hx^2 + Hy^2 + Hz^2} = Hx$$

$$B = \sqrt{Hx^2 + Hy^2}.$$

Therefore this equation defines a matrix that rotates all sampled magnetic field measurements such that the DC component is always in the x-direction. By DC component, what is meant is the long term average over time intervals which are long compared to possible target transit times of the sensor array 12.

Step 2. Find the best alignment of the y and z-planes. Let the x, y, z track positions of a test dipole towed relative to the sensor array 12 be given by $X_n$, $Y_n$, $Z_n$, for n = 1, 2, 3, ..., N, and let the estimated track values used by the dipole moment detection and localization process (using angles of $\alpha = (\alpha 1, \alpha 2, \ldots, \alpha 8)$) for the rotation in the y, z-planes) be given by $X_n(\alpha)$, $Y_n(\alpha)$, $Z_n(\alpha)$, for n = 1, 2, 3 ..., N. Define an optimization cost function by means of:

$$L = \sum_n [(Xn - X_n(\alpha))^2 + (Yn - Y_n(\alpha))^2 + (Zn - Z_n(\alpha))^2]$$

Step 3. Maximize the major axes cross-correlations. As described above let $A_x$, $A_y$, $A_z$ and $B_x$, $B_y$, $B_z$ be the residuals on the three axes of a pair of sensors 12a–12n after subtracting the long term mean. Then the cross-correlation matrix is the matrix:

$$C = E\left[\begin{pmatrix} A_x \\ A_y \\ A_z \end{pmatrix}(B_x, B_y, B_z)\right]$$

where the expectation E is given by an average over time. Using this procedure the estimate of the rotation matrix which will rotate the first sensor 12a to be in alignment with the second sensor 12n is the rotation matrix R which maximizes Tr(RC) where Tr indicates the trace of the matrix, i.e., the sum of the diagonal elements. The rotation is defined in terms of the three Euler angles of the rotation ($\theta$, $\phi$, $\Psi$). The rotation matrix is expressed in terms of the sines and cosines of these angles. The search is performed over S=( sin $\theta$, sin $\phi$, sin $\Psi$) since it is assumed that the initial uncertainty in each angle is less than plus or minus ninety degrees. The gradient of the trace is then expressible as:

$$\nabla_S(Tr(RC)) = E\begin{bmatrix} Tr\left(\frac{\partial R}{\partial \sin\theta}C\right) \\ Tr\left(\frac{\partial R}{\partial \sin\phi}C\right) \\ Tr\left(\frac{\partial R}{\partial \sin\phi}C\right) \end{bmatrix}$$

where $$\frac{\partial \cos\theta}{\partial \sin\theta} = \tan\theta, \frac{\partial \cos\phi}{\partial \sin\phi} = \tan\phi, \text{ and } \frac{\partial \cos\phi}{\partial \sin\phi} = \tan\phi.$$

A steepest descent search is performed in a conventional manner in the direction of the negative gradient, in the sines of the Euler angles, until the negative is minimized to the extent desired. By working with the rotation matrix R in terms of the Euler angles, the rotation matrix is maintained as an orthogonal matrix at each step.

Figure 4:
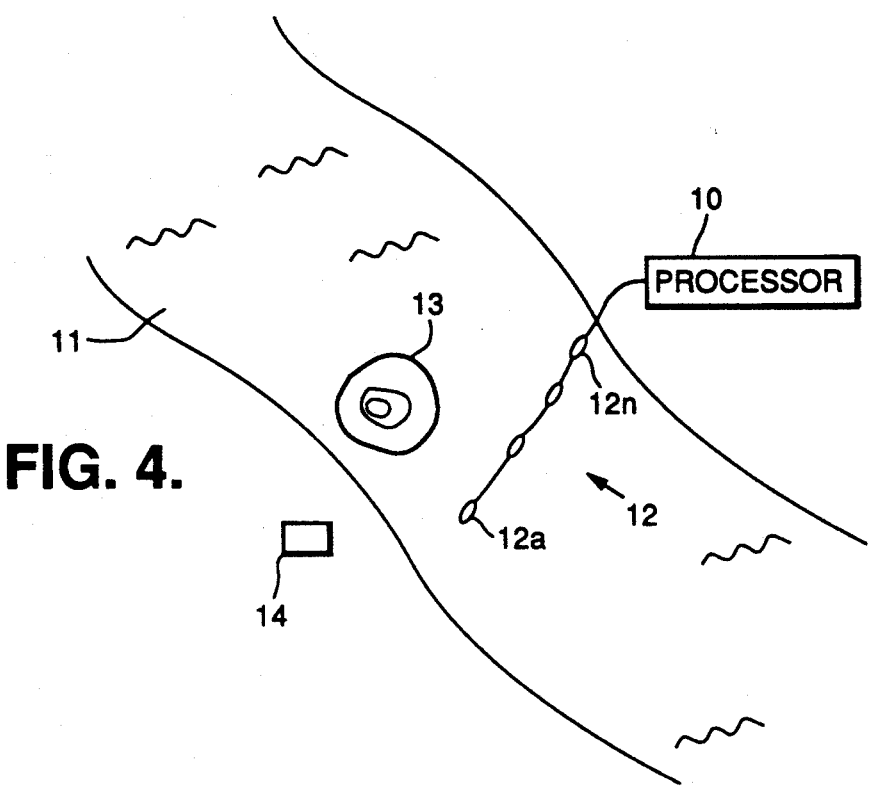
FIGS. 4 and 5 useful in illustrating registration of a local magnetic field with an array of sensors in accordance with the principles of the present invention.
Figure 5:
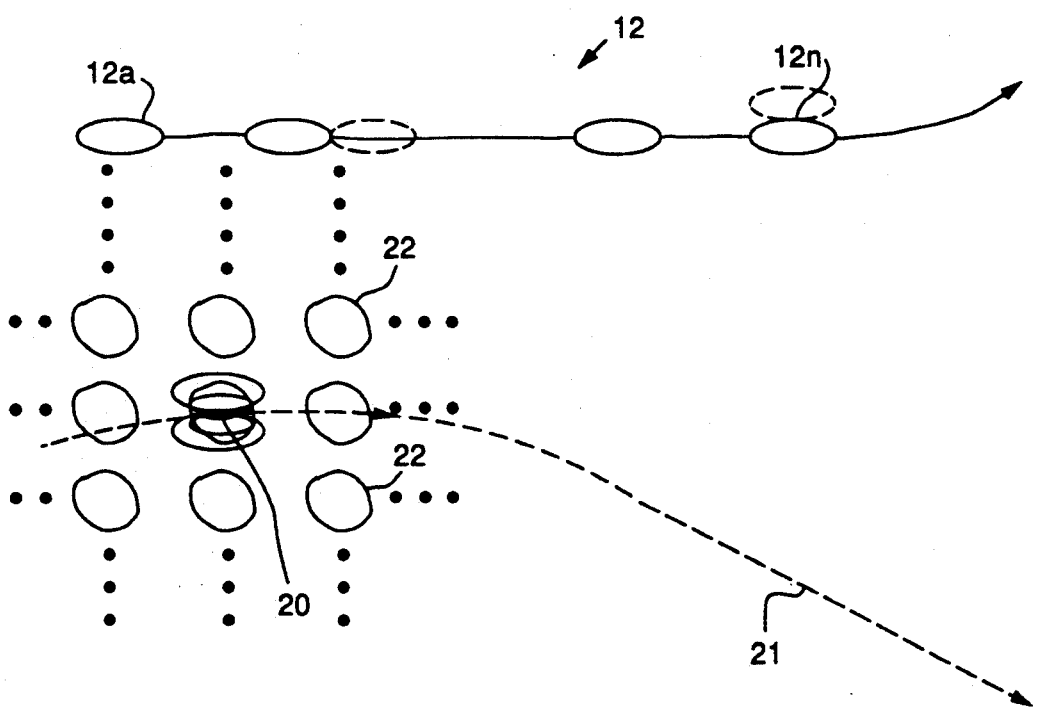

FIGS. 4 and 5 are useful in illustrating a process for use with a detection and localization processor 10 that registers a local magnetic field with an array of sensors 12 in accordance with the principles of the present invention. FIG. 4 shows a shipping channel 11, such as a river, for example, in which is disposed the array of sensors 12, comprising a plurality of sensors 12a–12n. A natural anomaly 13, such as a sunken ship, for example, is located in the shipping channel 11. In addition a man-made anomaly 14 is shown located on one bank of the shipping channel 11, which might be a radar station, for example, which has an effect on the magnetic field sensed by the array of sensors 12. The array of sensors 12 is laid down across the channel 11 with a nominal distribution of relative locations. The use of targets with known positions versus time, permits the calibration or registration of the actual locations of each of the individual sensors 12a–12n in the array of sensors 12.

An objective of the processing involved in sensor field registration of the system 10 is to determine the location of each of the sensors 12a–12n relative to one another. Another important objective is to determine how the real world environment affects the predicted operation of the system 10 due to local variations in the magnetic field properties, and appropriately adjust the processing characteristics to account for these effects of the environment.

Referring to FIG. 5, it shows a calibrated dipole source 20 having a predetermined orientation and field strength, which moves along a predetermined course 21 at a predetermined speed. As the dipole source 20 moves relative to the array of sensors 12, it moves through a series of magnetic response locations 22 identified as circles in FIG. 5. The magnetic field responses measured by each of the sensors 12 while the calibrated dipole source 20 is in each of the magnetic response locations 22 along the course 21 is measured and is compared to predetermined values that should be measured if the array of sensors 12 were in a perfectly straight line and were separated by exactly the same distance. If the sensors 12 are not in a straight line and separated by the same distance, the magnetic response measurement will be different than the predicted value. Therefore, the range to the calibrated dipole source 20 may be calculated and hence the relative positions of each of the sensors 12 can be determined.

Registration of the sensors 12 is performed using knowledge of the geographic location, and the layout of the array of sensors 12, and more particularly, through a calibration technique based on use of the earth's ambient magnetic field and the use of dipole tracking and estimating capabilities of the processor 10. There are two aspects to consider in determining the field registration of the sensors 12. First one must know the location and orientation of the magnetic sensors 12a-12n relative to one another, and second, one must understand the environment in which the sensors 12a-12n have been located. The dipole moment detection and location processing involves a calculation of the magnetic field which would be found for sensors 12a-12n in various locations. If the sensors 12a-12n are not in those locations, an error is detected and a degradation in performance results. Likewise if the noise and steady magnetic background of the geographic location of the system is not uniform then the nonuniformity is accounted for in the process for best results.

By introducing a known dipole moment (the dipole source 20) in the sensor field having a known course and speed, each sensor's position relative to each other sensor 12a-12n within the field is estimated. The process entails aligning each of the individual sensors 12a-12n with the earth's magnetic field using the process described with reference to FIGS. 1-3 prior to using the process of estimating the field layout. Once the sensor field is aligned and relative positions are established, permanent magnetic anomalies within range of the field are "registered" and their interfering nature removed from sensor data.

The process that may be used for the location of each sensor 12a-12n relative to one another is the following. Let the x, y, z track positions of the dipole source 20 (at N time points) towed through a sensor field be given by $X_n$, $Y_n$, $Z_n$, where $n = 1, 2, 3, \ldots, N$, and let the estimated track values (using assumed sensors positions of $(x, y, z) = ((x, y, z)_1, (x, y, z)_2, \ldots, (x, y, z)_M$, for M equal to the number of sensors) used in the dipole moment detection and localization process be given by $X_n((x, y, z))$, $Y_n((x, y, z))$, $Z_n((x, y, z))$, where $n = 1, 2, 3 \ldots, N$. Define an optimization cost function by means of the equation $$L = \sum_n [(X_n - X_n((x,y,z)))^2 + (Y_n - Y_n((x,y,z)))^2 + (Z_n - Z_n((x,y,z)))^2].$$

The estimate of the sensor positions for the purposes of field registration is the selection of the 3M values in (x, y, z) which minimize L.

Thus there has been described new and improved three axis magnetometer sensor field alignment and registration processes. It is to be understood that the above-described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A method of electronically aligning output signals comprising magnetic field responses of a plurality of three axis magnetic sensors comprising a distributed sensor array subsequent to their deployment, said method comprising the steps of:

deploying a plurality of three axis magnetic sensors;

sensing output signals comprising magnetic field responses along x, y, and z axes of each of the plurality of sensors;

electronically aligning the x axis of each magnetic sensor with a predefined earth's magnetic field by adjusting compensation values of a three axis rotation matrix associated with each sensor such that only the x axis value is nonzero;

electronically aligning the y and z axes of each magnetic sensor by moving a calibrated dipole source having a known magnetic strength and signature along a known path relative to the plurality of sensors and adjusting the rotation matrix of each sensor to get desired magnetic field responses at predetermined magnetic response locations along the path;

repeating the above steps a predetermined number of times until the the desired magnetic field responses are achieved.

2. The method of claim 1 which further comprises the step of:

adjusting the rotation matrix to get the desired magnetic response location values in response to an earth scale event, such that all magnetic field responses respond in like manner to the earth scale event.

3. The method of claim 1 which further comprises determining the relative locations of a plurality of sensors with respect to each other, which sensors comprise an array of three axis magnetic sensors disposed relative to the earth's magnetic field, said method comprising the steps of:

electronically aligning the x, y, and z axes of each sensor of the array with the magnetic axes of the earth's magnetic field, by adjusting a rotation matrix associated with output signal derived from each sensor until a desired magnetic field response is achieved at predetermined magnetic response locations associated with the array of sensors;

moving a calibrated dipole source having a known magnetic strength and signature along a known path relative to the array of sensors that moves through a plurality of magnetic response locations that have predetermined magnetic response values associated therewith that correspond to the calibrated dipole source;

measuring the field strength generated by the calibrated dipole source as it moves along the path at each sensor location;

computing the relative ranges to the magnetic response locations from adjacent sensor locations; and computing the relative locations of the plurality of sensors with respect to each other using the relative ranges to the magnetic response locations.

4. The method of claim 3 wherein the step of computing the relative locations of the plurality of sensors comprises the step of:

determining the values of of x, y, and z that minimize the value of L in the equation $$L = \sum_n [(X_n - X_n((x,y,z)))^2 + (Y_n - Y_n((x,y,z)))^2 + (Z_n - Z_n((x,y,z)))^2].$$

where x, y, z are the track positions of the dipole source as it is moved through the sensor field, the sensor field is given by Xn, Yn, Zn, where n=1, 2, 3, ..., N, and the estimated track values are given by $X_n((x,y,z))$, $Y_n((x,y,z))$, $Z_n((x,y,z))$, where n=1, 2, 3 ..., N, and where the sensor positions are $(x,y,z) = ((x,y,z)_1, (x,y,z)_2, ..., (x,y,z)_M$, for M equal to the number of sensors.

5. A method of determining the relative locations of a plurality of sensors with respect to each other, which sensors comprise an array of three axis magnetic sensors disposed relative to the earth's magnetic field, said method comprising the steps of:

electronically aligning the x, y, and z axes of each sensor of the array with the magnetic axes of the earth's magnetic field, by adjusting a rotation matrix associated with output signal derived from each sensor until a desired magnetic field response is achieved at predetermined magnetic response locations associated with the array of sensors;

moving a calibrated dipole source having a known magnetic strength and signature along a known path relative to the array of sensors that moves through a plurality of magnetic response locations that have predetermined magnetic response values associated therewith that correspond to the calibrated dipole source;

measuring the field strength generated by the calibrated dipole source as it moves along the path at each sensor location;

computing the relative ranges to the magnetic response locations from adjacent sensor locations; and computing the relative locations of the plurality of sensors with respect to each other using the relative ranges to the magnetic response locations.

6. The method of claim 3 wherein the step of computing the relative locations of the plurality of sensors comprises the step of:

determining the values of of x, y, and z that minimize the value of L in the equation $$L = \sum_n [(X_n - X_n((x,y,z)))^2 + (Y_n - Y_n((x,y,z)))^2 + (Z_n - Z_n((x,y,z)))^2].$$

where x, y, z are the track positions of the dipole source as it is moved through the sensor field, the sensor field is given by Xn, Yn, Zn, where n=1, 2, 3, ..., N, and the estimated track values are given by $X_n((x,y,z))$, $Y_n((x,y,z))$, $Z_n((x,y,z))$, where n=1, 2, 3 ..., N, and where the sensor positions are $(x,y,z) = ((x,y,z)_1, (x,y,z)_2, ..., (x,y,z)_M$, for M equal to the number of sensors.

* * * * *